United States Patent
Maalouf et al.

(10) Patent No.: US 12,261,571 B2
(45) Date of Patent: Mar. 25, 2025

(54) BIAS CONTROL CIRCUIT FOR POWER TRANSISTORS

(71) Applicant: NXP USA, Inc., Austin, TX (US)

(72) Inventors: Elie A. Maalouf, Mesa, AZ (US); Xu Jason Ma, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 591 days.

(21) Appl. No.: 17/705,971

(22) Filed: Mar. 28, 2022

(65) Prior Publication Data

US 2023/0308052 A1 Sep. 28, 2023

(51) Int. Cl.
*H03F 1/30* (2006.01)
*H03F 1/02* (2006.01)
*H03F 3/21* (2006.01)

(52) U.S. Cl.
CPC ............ *H03F 1/0211* (2013.01); *H03F 3/21* (2013.01); *H03F 2200/15* (2013.01)

(58) Field of Classification Search
CPC ................ H03F 1/30; H03F 3/20; H03G 3/30
USPC ................................................. 330/296, 285
See application file for complete search history.

(56) References Cited

U.S. PATENT DOCUMENTS

| | | | |
|---|---|---|---|
| 5,986,508 A * | 11/1999 | Nevin | H03F 1/301 330/296 |
| 6,215,358 B1 * | 4/2001 | Hon | H03F 1/306 330/296 |
| 6,891,438 B2 * | 5/2005 | Arai | H03F 1/301 330/296 |
| 10,277,176 B2 | 4/2019 | Bettencourt et al. | |
| 10,819,290 B2 | 10/2020 | Ranta et al. | |
| 2018/0083578 A1 | 3/2018 | Klaren et al. | |
| 2020/0099344 A1 | 3/2020 | Maalouf et al. | |

FOREIGN PATENT DOCUMENTS

EP 2541763 B1 12/2018

OTHER PUBLICATIONS

Lee, Seungkyeong et al; "A 1.7-GHz GaN MMIC Doherty power amplifier using an adaptive bias circuit with a quadrature coupler"; IEEE Int'l Symposium on Radio-Frequency Integration Technology (RFIT); 3 pages (2017).
Gu, Liming et al; "Dual-band GaN power amplifiers with novel DC biasing networks incorporating offset Dspsl"; IEEE MMT-S Int'l Microwave Workshop Series on Advanced Materials and Processes for RF and THz Applications; 4 pages (2015).

* cited by examiner

*Primary Examiner* — Henry Choe

(57) ABSTRACT

A system includes a reference field effect transistor (FET), wherein the reference FET is a depletion mode transistor, and a bias control circuit. The bias control circuit includes a voltage sensor connected to a drain terminal of the reference FET. The voltage sensor is configured to measure a voltage at the drain terminal of the reference FET as a measured voltage, determine a voltage difference between a reference voltage and the measured voltage, and output the voltage difference at a voltage sensor output terminal. The system includes a translation circuit connected the voltage sensor output terminal. The translation circuit is configured to convert the voltage difference into a negative gate bias voltage, and apply the negative gate bias voltage to a gate terminal of the reference FET.

16 Claims, 5 Drawing Sheets

BIAS CONTROL CIRCUIT FOR POWER TRANSISTORS

TECHNICAL FIELD OF THE INVENTION

The present disclosure relates generally to systems for biasing power amplifiers, and, more specifically, to a bias control circuit for a power transistor of a power amplifier.

BACKGROUND OF THE INVENTION

Various wireless transmission systems use power amplifiers for increasing the power of a high frequency signal. In a wireless communication system, a power amplifier is usually the last amplifier in a transmission chain (i.e., the output stage). High gain, high linearity, stability, and a high level of efficiency—the ratio of radio frequency (RF) output power to direct current (DC) power—are characteristics of an ideal amplifier.

To achieve efficient operation the power amplifier, a power amplifier's power transistor is biased with DC voltages to set the operating mode of the power transistor to achieve desired linearity and efficiency operations. However, variations in the transistor over time (e.g., due to manufacturing and temperature variations of the power transistor die) can alter the transistor's threshold voltages. As such, a bias voltage that may correctly set the power transistor at a first time may become inaccurate as the transistor's threshold voltages change over time. As such, during operations, a transistor that perform as desired at a particular bias voltage may, over time, begin to exhibit undesirable operation. Consequently, a failure to bias the power transistor at its threshold voltage consistently can reduce overall power amplifier efficiency and linearity.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
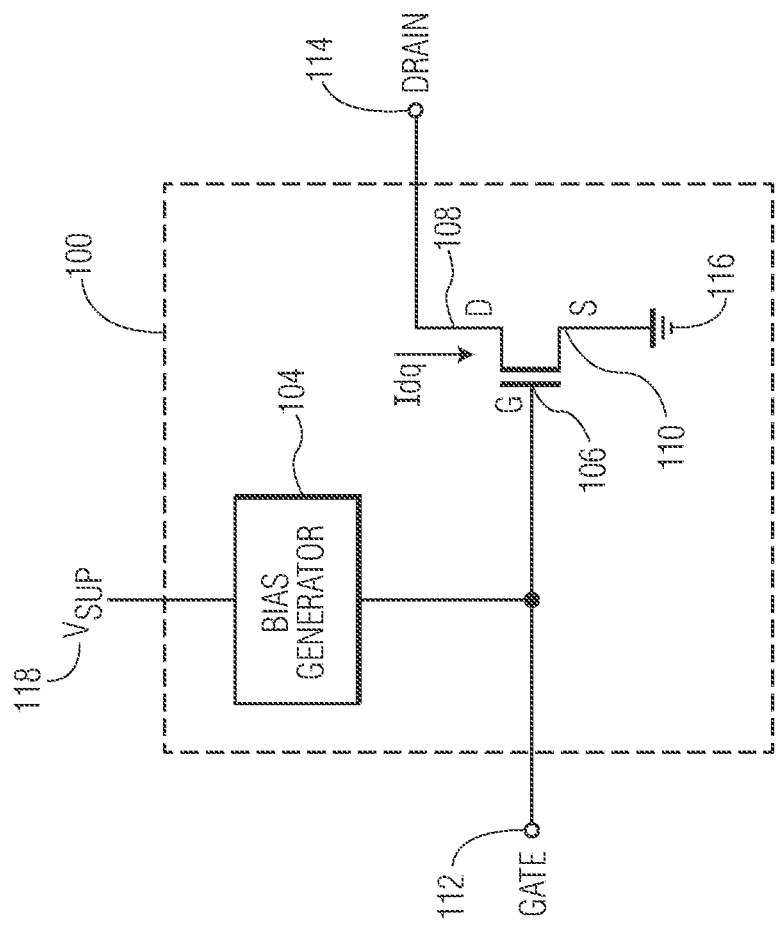
FIG. 1 is a simplified block diagram illustrating an exemplary amplifier device comprising a field effect transistor coupled to a bias voltage input.

Power amplifiers, such as those incorporated into wireless transmission systems, include transistors configured to amplify the power of a high frequency signal to a level suitable for transmission. To provide desired operation of the power amplifier (e.g., to achieve desired efficient and/or linear performance), the amplifier's power transistors are biased via direct current (DC) voltages into desired modes of operation. However, variations in the transistor's operations over time (e.g., due to manufacturing, temperature, and age variations of the transistor die) can produce changes in a transistor's threshold voltages over time. As such, bias voltages that may appropriately bias a transistor at one time may not properly bias the same transistor at another time. A failure to bias the power transistor properly based upon that transistor's threshold voltage can reduce overall power amplifier efficiency and linearity.

For example, power amplifiers may be use in communication system in which the communication of RF signals utilize designated time slots within a frequency band to transmit or receive signals. When transmitting a signal in such systems, an RF transceiver power amplifier is operated in a pulsed mode, amplifying an applied RF signal only during each designated time slot, and being powered OFF at other times. In this environment, it can be important that the power transistors of a power amplifier are biased properly and repeatedly at the appropriate quiescent current level to ensure adequate linearity and efficiency trade-offs.

The present disclosure provides a bias control circuit that may be utilized to dynamically determine suitable biasing voltages for one or more power transistors of a power amplifier. As such, the present bias control circuit may serve to mitigate poor amplifier performance due to part-to-part and temporal transistor bias variations that can occur due to the aforementioned variation of transistor threshold voltages resulting from process variations, age, and temperature changes. By allowing for the dynamic determination of suitable bias control voltages for a power transistor, the present bias control circuit can reduce the need for extensive and manual bias calibration routines that may typically be implemented by end users to account for variations in relation to conventional power amplifier modules.

In an embodiment, the present bias control system may be utilized in conjunction with a power amplifier that includes a power transistor and a reference transistor integrated into the same power transistor die. Because the reference transistor and the power transistor are incorporated into the same die, the reference transistor and the power transistor may exhibit the same, or at least comparable, process, age, and temperature variations during operation of the power transistor. And, as such, the bias control circuit can be configured to monitor the operation of the reference transistor in order to at least partially determine suitable bias voltages to be applied to the power amplifier's power transistor to achieve a desired operation of the power transistor.

FIG. 1 depicts a simplified block diagram of an exemplary amplifier device 100. Device 100 includes a field effect transistor (FET) transistor 102 having a gate (G) terminal 106, a drain (D) terminal 108, and a source (S) terminal 110.

Transistor 102 may be an n-type power MOSFET (nMOS) transistor suitable for use, for example, in a radio frequency (RF) power amplifier circuit capable of operating at frequencies above about 400 megahertz (MHz), although essentially any transistor device (e.g., p-type MOS transistor, bipolar junction transistor (BJT), etc.) can be used, with or without modifications to the IC device 100, as will be understood by those skilled in the art. Such power amplifier circuits may be employed, for instance, in a multi-carrier and/or single-carrier wireless base station.

Further, in some embodiments, transistor 102 may be a gallium nitride (GaN) FET, although in other embodiments, transistor 102 may be another type of III-V transistor (e.g., gallium arsenide (GaAs), gallium phosphide (GaP), indium phosphide (InP), or indium antimonide (InSb)), or another type of transistor that has a relatively low drain-source capacitance. In various embodiments, the substrate of device 100 in which transistor 102 is formed generally includes bulk or composite semiconductor materials (e.g., silicon (Si), gallium nitride (GaN), gallium arsenide (GaAs), silicon-on-insulator (Sop, silicon germanium (SiGe), GaN-on-insulator (e.g., GaN on Si, GaN on silicon carbide, GaN on sapphire, and so on), or other suitable materials).

A gate input terminal 112 of the device 100 is coupled to the gate terminal 106 of the transistor 102. A drain terminal 114 of device 100 is coupled to the drain terminal 108 of transistor 102. Source terminal 110 of transistor 102 may be connected to a ground node or DC voltage supply, which may be ground or an alternative voltage source.

Device 100 includes a bias voltage generator 104 coupled to the gate terminal 106 of transistor 102. Bias voltage generator 104 is configured to output a DC bias voltage that is configured to bias transistor 102 into a desired mode of operation. In various embodiments, the DC bias voltage supplied by bias voltage generator 104 is configured to bias transistor 102 at a substantially constant quiescent operating point.

Bias voltage generator 104 may include an input for receiving a supply voltage ($V_{SUP}$) 118.

In desired operations, the quiescent bias current of a transistor device remains substantially constant over temperature and/or process variations so that an amplifier circuit utilizing such device will not experience a degradation in performance (e.g., linearity, gain, efficiency, etc.) over time. Because the quiescent bias current (Idq) of transistor 102 is largely dependent upon, among other parameters, a threshold voltage of the device, which can exhibit a temperature and age dependence, biasing the transistor device with a fixed bias voltage may not be adequate.

Figure 2:
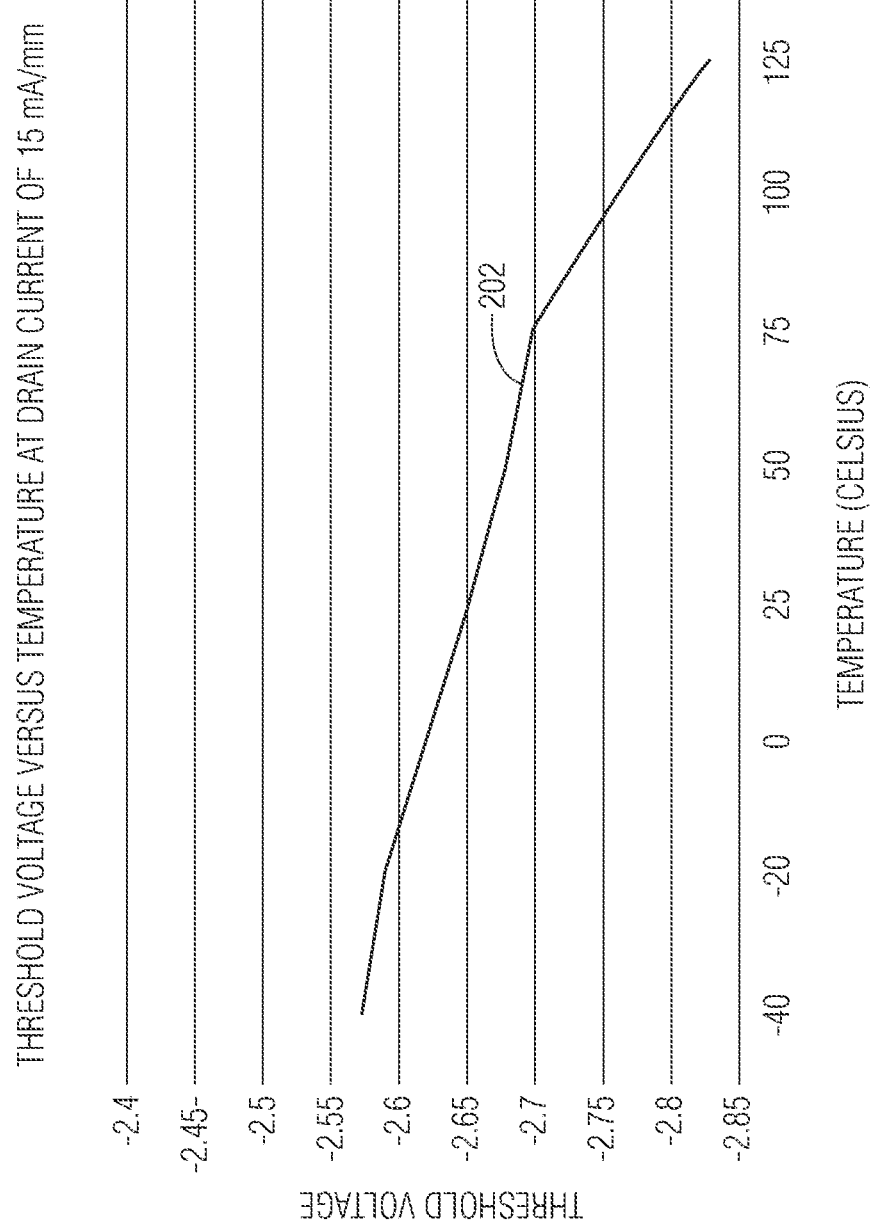
FIG. 2 is a chart depicting the relationship of a GaN transistor's threshold voltage compared to the FET's temperature.

To illustrate, FIG. 2 is a chart depicting the relationship of a GaN FET's threshold voltage (vertical axis, V) compared to the FET's temperature (horizontal axis, Celsius). As depicted by line 202, as the temperature of the FET changes, the FET's threshold voltage also changes. Specifically, as the FET's temperature increases, the threshold voltage decreases in a non-linear manner. During operation of power amplifiers, such as those utilized within wireless communication systems, the amplifier's power transistor's operations are not constant over time and will change depending upon the volume or wireless communication traffic. Due to this variation in operation, the temperature of the power amplifier's transistor will not be constant (or predictable) over time, resulting in a constantly varying threshold voltage over time.

Due to the variations in threshold voltage of the transistor 102 over time (either due to temperature changes or other factors), it can be important that bias voltage generator 104 be configured to adjust the generated bias voltage in a manner that compensates for temperature and age variations in transistor 102's threshold voltage. Although conventional approaches to this problem may rely on bias control systems that directly sense the temperature of a transistor in order to deliver a bias voltage that is at least partially determined by that sensed temperature, such circuits are generally incapable accurately adjusting the bias voltage in a manner that accurately track the junction temperature of the transistor device itself, resulting in incorrect bias voltages being generated. Additionally, such approaches generally rely on fixed translation of a sensed temperature to a particular bias voltage and as such fail to compensate for variations in transistor threshold voltages due to aging of the transistor device (or other factors).

During operation of device 100, an input RF signal level (e.g., supplied as an input signal to gate terminal 112) is not constant, and therefore the temperature of the transistor 102 varies over time. The present disclosure provides an automatic bias control system that compensates a transistor's bias voltage over time to compensate for temperature and age-based variations in the transistor's threshold voltage.

The present bias control circuit may be utilized in conjunction with an amplifier device that includes a reference transistor (e.g., a GaN reference transistor) formed within the same semiconductor die or substrate as the device's power transistor (e.g., a GaN power transistor). By monitoring the operation of the reference transistor, the bias control circuit is able to determine a bias voltage (or generate an output that may be utilized to determine an appropriate bias voltage) for the power amplifier's power transistor to set a desired operational mode of that power transistor.

As described herein, the present bias control circuit incorporates a charge pump subsystem configured to generate an adequate supply voltage (e.g., about 10 volts (V)) that exceeds the knee voltage of the reference transistor. That supply voltage is then used to supply a drain current for the device's reference transistor. The drain current drives the reference transistor out of its knee transition region. A voltage sensing, level translation and control circuit generates a transistor gate voltage that is at least partially determined by the drain current, thereby creating a control loop to implement a bias control loop for the reference transistor. The control loop is configured to overcome gate leakage current as well as process variations and is generally independent of the reference transistor's threshold voltage. The bias control circuit can then be used to create a gate bias voltage for the device's power transistor. For example, in an embodiment, the gate bias voltage supplied to the device's power transistor may be determined by the gate voltage of the reference GaN transistor, which is determined by the bias control circuit.

In typical applications, a power transistor of a power amplifier device (e.g., an RF amplifier) may be implemented within the same semiconductor die as the reference transistor. In RF applications, the power transistor may be configured to operate at frequencies ranging from 1-50 gigahertz (GHz) or higher and power levels ranging from 11-100 Watts or higher, though in various embodiments, the present bias control circuit and method may be implemented conjunction with transistors operating at any frequency (e.g., low frequencies) and/or power level (e.g., lower power levels). In other implementations, however, the reference transistor may be implemented in the same semiconductor die as any other type of device transistor (power transistor or otherwise), in which the present bias control circuit is configured to monitor and control the operation of the reference transistor as a means of determining a suitable gate bias voltage for the transistor.

Figure 3:
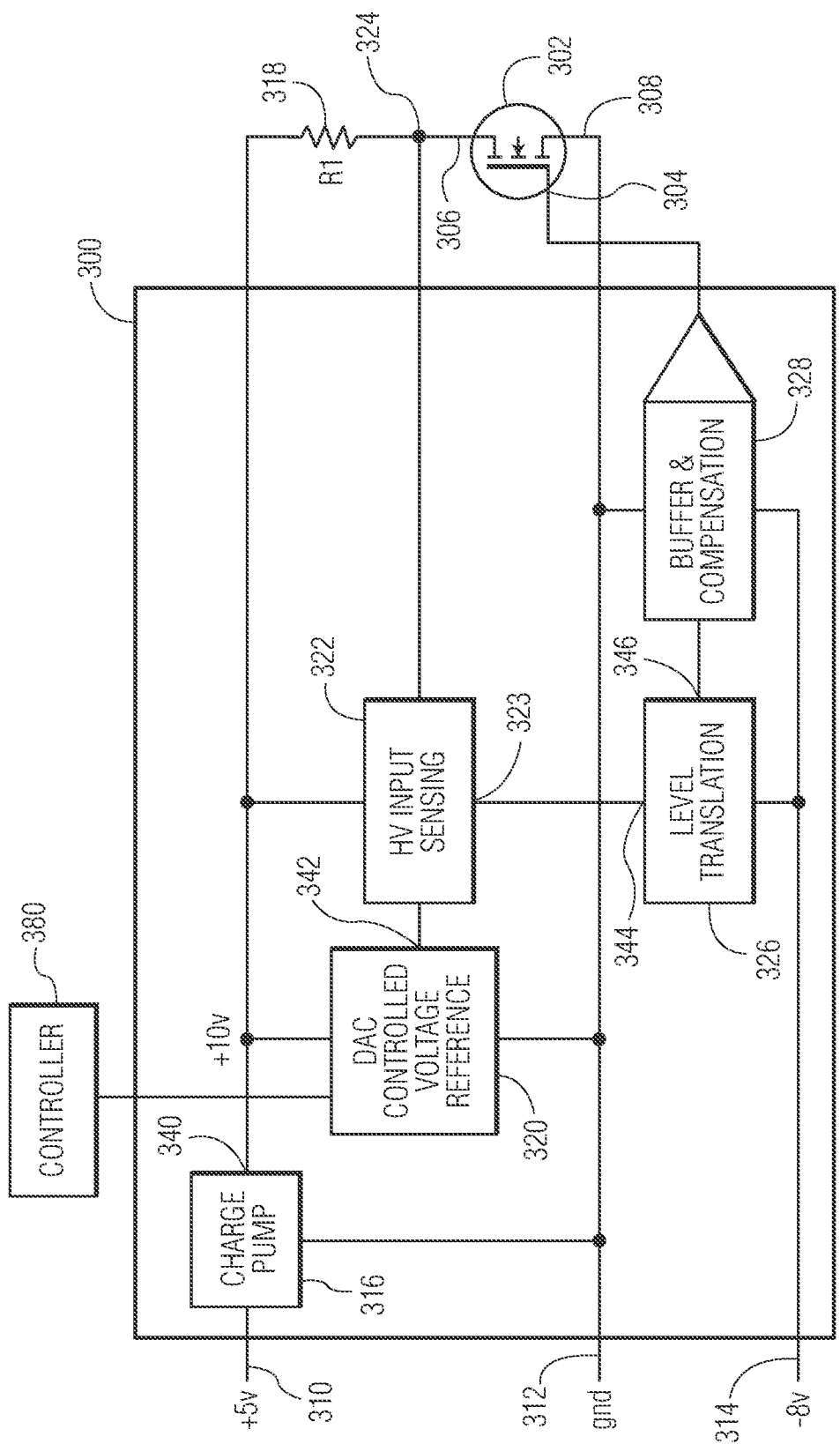
FIG. 3 is a block diagram depicting functional components of a bias control circuit operating in conjunction with a reference in accordance with the present disclosure.

FIG. 3 is a block diagram depicting functional components of bias control circuit 300 operating in conjunction with a reference FET 302. Reference FET 302 may be a GaN transistor that is configured similarly as a corresponding power transistor of a power amplifier device (e.g., transistor 102 of device 100 of FIG. 1; power transistors of dual stage peaking amplifier 524 or dual stage carrier amplifier 526 of FIG. 5). For example, reference FET 302 may be implemented using the same semiconductor materials and/or within the same semiconducting substrate as a power GaN transistor of a power amplifier device. In embodiments, the reference FET 302 and the amplifier device's power GaN transistor share the same or substantially the same structure and geometry. In that case, the reference FET 302 can be a geometrically scaled-down version of the power GaN transistor that the various structures within the reference FET 302 have the same general shape and construction as those of the corresponding power GaN transistor, but have reduced sizes in all three dimensions. Consequently, reference FET 302 generally has a smaller periphery than the corresponding power GaN transistor.

In a typical application, the reference FET 302 is formed within close proximity to the power GaN transistor within the transistor die and so will generally be exposed to similar ambient temperature conditions as the power transistor. Due to their similar construction, therefore, both reference FET 302 and the power transistor will tend to exhibit similar operating characteristics. As such, by monitoring the performance of and determining appropriate biasing conditions for the reference FET 302 it is possible use those biasing conditions to determine appropriate biasing conditions for the power amplifier's power transistor. As the power transistor's operating characteristics change over time (e.g., due to transistor aging, temperature changes, or process variations), reference FET 302 will tend to exhibit similar changes. As such, by updating the biasing conditions for reference FET 302 as its operating conditions change, biasing for the power transistor can be similarly updated to account for its changes in operating conditions over time. For example, such changes in operating conditions may include changes in the gate-source threshold voltage of both the reference FET 302 and the power transistor due to, aging, changes in temperature, or process variations. As such, the gate-to-source threshold voltage of reference FET 302 is correlated with a gate-to-source threshold voltage of the power transistor, given changes in temperatures of the reference transistor and the power transistor and ages of the reference transistor and the power transistor.

Reference FET 302 has a gate terminal 304 that operates as a control terminal for reference FET 302, a drain terminal 306, and a source terminal 308. Reference FET 302 may be an n-type power MOSFET (nMOS) transistor suitable for use, for example, in a radio RF power amplifier circuit.

Reference FET 302 may be a GaN FET, although in other embodiments, reference FET 302 may be another type of III-V transistor (e.g., GaAs, GaP, InP, SiGe, or InSb), or another type of transistor that has a relatively low drain-source capacitance. In various embodiments, the substrate of the integrated circuit (IC) device in which reference FET 302 is formed generally includes bulk or composite semiconductor materials (e.g., Si, GaN, GaAs, SoI, SiGe, GaN-on-insulator (e.g., GaN on Si, GaN on silicon carbide, GaN on sapphire, and so on), or other suitable materials).

Because both the power amplifier transistor and reference FET 302 of a power amplifier device have similar configurations, they tend to exhibit similar performance characteristics. Specifically, both the power amplifier transistor and reference FET 302 will tend to transition from linear operation to saturation at similar saturation drain-to-source voltages ($V_{Ds}$). This saturation voltage ($V_{sat}$) for GaN-based transistors tends to be at a voltage of approximately +8 V. Generally, it is desirable to avoid operation of transistors in a power amplifier device at a $V_{Ds}$ that is about equal to or less than $V_{sat}$ because relatively small variations in transistor drain voltage can result in large variations in transistor current. Accordingly, if reference FET 302 (and the corresponding power transistor) were to be biased at $V_{Ds}$s of about $V_{sat}$ or less, the corresponding power amplifier may have reduced linearity and efficiency.

To facilitate proper biasing of a corresponding power transistor in a power amplifier device, the present bias control circuit 300 is configured to implement a feedback loop enabling reference FET 302 to be properly biased to enable operation of reference FET 302 at a desired biasing point. Because bias control circuit 300 implements a feedback-control loop, bias control circuit 300 is configured to adjust the gate bias voltage supplied to gate terminal 304 of reference FET 302 to maintain reference FET 302 at a desired bias point even as the gate threshold of reference FET 302 changes over time.

With reference FET 302 properly biased, the bias voltage being supplied to reference FET 302 to maintain reference FET 302 as the desired bias point can be used to derive a suitable biasing voltage for the corresponding power transistor in the power amplifier device. Because the power transistor and reference FET 302 are of similar construction, variations in operating parameters (e.g., gate-source threshold voltage) of the reference FET 302 are correlated with those of the power transistor. Consequently, as the suitable bias voltages for both the reference FET 302 and the power transistor change over time, the bias voltage being supplied to the power amplifier's power transistor is automatically adjusted to compensate for such changes. That is, by using the gate voltage applied to the reference FET 302 as the DC bias voltage applied to the power transistor, variations in such operating parameters caused by aging, changes in temperature, or process variations are inherently accounted for. In this way, the impact of such variations on the operation of the power amplifier may be mitigated. In a specific embodiment, for example, gate terminal 304 of reference FET 302 may be directly electrically connected to the gate terminal of the corresponding power transistor so that the gate voltage applied to the reference FET 302 is directly applied to the power transistor's gate terminal as a bias voltage.

Bias control circuit 300 has a power supply configured to generate positive and negative supply voltages. In a typical power amplifier device, the positive power supply has a voltage of about 5 V supplied via positive power supply terminal 310. The power supply is also configured to generate a negative supply voltage (e.g., of about –8 V) supplied via negative power supply terminal 314. Finally, the power supply provides a ground voltage that is supplied via ground supply terminal 312.

In typical power amplifier configurations, the 5 V power supply supplied by positive power supply terminal 310 is below the $V_{sat}$ that would put the reference FET 302 into saturation. If reference FET 302 is implemented as a GaN transistor, for example, $V_{sat}$ may be about 8 V. Because the operation of bias control circuit 300 requires the generation of drain voltages adequate to put reference FET 302 into its saturation state, bias control circuit 300 includes a charge pump 316 configured to increase the positive power supply voltage of 5 V to a voltage that exceeds the drain-source saturation voltage for reference FET 302.

Specifically, in the depicted embodiment, charge pump 316 is configured to generate an output voltage of +10 V at output terminal 340. Charge pump 316 may be implemented as a switching capacitor pump circuit although charge pump 316 may be implemented in any other suitable manner to enable charge pump 316 to increase the supply voltage to a voltage that exceeds the drain-source saturation voltage $V_{sat}$ for reference FET 302. In general, when reference FET 302 is a GaN transistor, the voltage output by charge pump 316 at output terminal 340 is about 9.5 V or greater (i.e., a value that exceeds the GaN transistor's $V_{sat}$) up to a maximum voltage equivalent to the voltage limit of the transistor (e.g., around 48 V).

The output terminal 340 of charge pump 316 is connected to drain terminal 306 of reference FET 302 through resistor 318. The voltage output generated by charge pump 316, in combination with resistor 318 operates as a current source configured to supply a drain current to drain terminal 306 of reference FET 302. In typical embodiments, resistor 318 is implemented as a high tolerance resistor (e.g., a carbon resistor) with a resistance of resistor 318 may range from 200 Ohms to 500 Ohms, although other embodiments may include resistors having different resistance values.

Bias control circuit 300 includes a reference voltage source 320 connected between output terminal 340 and ground supply terminal 312. Reference voltage source 320 is configured to generate an output reference voltage at terminal 342 that is a fractional value of the output voltage generated by charge pump 316 at output 321. Specifically, an external control system implemented by controller 330 (e.g., a general-purpose processor or IC) provides a control input to reference voltage source 320 that determines the value of the reference voltage that is output by reference voltage source 320. The input signal supplied by controller 330 may be a signal specifying a particular output voltage or a signal (e.g., a digital signal) that indicates a fractional amount of the voltage generated by charge pump 316 at output terminal 340 that should be output by reference voltage source 320 as its reference voltage. In this arrangement, controller 330 can control the reference voltage that is output by reference voltage source 320 at terminal 342. As described below, controller 330 is configured to control the output reference voltage of reference voltage source 320 to establish a desired bias point for reference FET 302.

A voltage sensor 322 is coupled between terminal 342 of voltage reference 320 to receive the reference voltage generated by reference voltage source 320 and node 324, where node 324 is between resistor 318 and drain terminal 306 of reference FET 302 and represents the drain voltage of reference FET 302. Voltage sensor 322 is configured to measure the voltage outputted by voltage reference 320 and the voltage at node 324 and compare the two values to determine a voltage difference. Voltage sensor 322 outputs the difference at an output terminal at terminal 323. Voltage sensor 322 may operate as an analog comparator in which case the output at terminal 323 may be an analog value equal to the voltage difference.

A translation circuit 326 is configured to receive the voltage difference (e.g., error) determined by voltage sensor 322 at input terminal 344 and convert that voltage into a corresponding voltage that may be applied as a gate bias voltage to gate terminal 304 of reference FET 302. Because the reference FET 302 is a depletion mode device, the threshold voltage of reference FET 302 is typically between −2 v to −3.5 v. As such, translation circuit 326 is configured to convert the voltage difference (e.g., error) output by voltage sensor 322 into an equivalent negative supply voltage range (e.g., a voltage value that is referenced the negative supply voltage of negative power supply terminal 314 so that the voltage value is a fraction of the negative supply voltage, where the fraction is determined based upon the value of the voltage difference) suitable for application as a gate voltage to reference FET 302. Typically, this involves translation circuit 326 The negative voltage, once generated by translation circuit 326 is output at output terminal 346 and supplied to gate terminal 304 of reference FET 302 via current output stage 328.

When implemented as a GaN transistor, the gate terminal 304 of reference FET 302 has a leaky Schottky diode structure, which can result in a micro-amp current flowing through the reference FET 302 even when the gate terminal 304 is biased at a negative voltage. To overcome this leaky current, a current output stage 328 is connected between the output of translation circuit 326 and the gate terminal 304 of the reference FET 302. Current output stage 328 can provide loop stability by operating as a current buffer.

During operation of bias control circuit 300, bias control circuit 300 operates as a closed-loop control circuit to properly bias the GaN reference FET 302 in a controlled manner while accounting for changes in the threshold voltage of reference FET 302 that may occur over time (e.g., due to process, temperature, or operating condition changes). In this manner, the bias control circuit 300 can account for process variations and threshold shifting caused by aging and temperature changes in the reference FET 302.

Specifically, during operation of bias control circuit 300 a control input received from controller 330 specifies the value of the reference voltage to be generated by reference voltage source 320 at output 321.

Voltage sensor 322 then compares that reference voltage to the reference FET 302 drain voltage at node 324. If voltage at node 324 is greater than the reference, the output terminal of voltage sensor 322 at terminal 323 is a positive voltage equal to the magnitude of that difference. The positive voltage output by voltage sensor 322 at terminal 323 is then translated into a corresponding negative gate bias voltage to be applied to gate terminal 304 of reference FET 302 by translation circuit 326. When the difference between the reference voltage output by reference voltage source 320 and the voltage measured at node 324 increases (indicating that the voltage at node 324 is becoming increasingly greater than the reference voltage), translation circuit 326 translates that increasingly positive voltage into an increasingly negative output voltage. As that increasingly negative voltage is applied to gate terminal 304 of reference FET 302, the increasingly negative voltage acts to push reference FET 302 further towards its saturation region, which, in turns, increases the drain current Id of reference FET 302. The increase in drain current Id reduces the voltage at drain terminal 306 thereby reducing the difference (i.e., minimizing the "error") between the reference voltage output by reference voltage source 320 pushing the control circuit back to an equilibrium where the voltage at drain terminal 306 is equal to the reference voltage generated by reference voltage source 320 at terminal 342.

Conversely, if the difference between the reference voltage output by reference voltage source 320 and the voltage measured at node 324 indicates that the voltage at node 324 is less than the reference voltage, translation circuit 326 translates that difference into a less negative output voltage. As that less negative voltage is applied to gate terminal 304 of reference FET 302, the less negative gate voltage acts to reduce the drain current Id of reference FET 302. The reduction in drain current results in an increased voltage at drain terminal 306 thereby again reducing the difference (or the "error") between the reference voltage output by reference voltage source 320.

In this manner, the control feedback loop formed by the combination of reference voltage source 320, voltage sensor 322, translation circuit 326, and current output stage 328 operate together to modulate the operation of reference FET 302 so that the voltage at node 324 is held or maintained to a value that is equal to or almost equal to the reference voltage generated by reference voltage source 320. As the operation of reference FET 302 changes over time (e.g., due to aging or temperature changes) the voltage at node 324 will become unequal to the reference voltage generated by reference voltage source 320. In that case, voltage sensor 322 and translation circuit 326 operate together to increase or decrease the gate voltage to be applied to gate terminal 304 of reference FET 302 so that the voltage at node 324 returns to being equal to the reference voltage.

In typical applications, controller 330 is configured to cause reference voltage source 320 to output a reference voltage so that when node 324 is at the reference voltage a desired voltage drop across resistor 318 is observed and, consequently, a desired drain current Id is supplied to drain terminal 306 of reference FET 302. Accordingly, controller 330 may be thought of as being configured to select a desired drain current for reference FET 302. In an embodiment, for example, controller 330 may configured to store and access a look-up-table that maps a number of different target drain current values to the corresponding reference voltages that, when generated by reference voltage source 320, will result in reference FET 302 having that desired drain current.

With bias control circuit 300 operating, reference FET 302 is properly biased according to the control signal received from controller 330 and the corresponding reference voltage generated by reference voltage source 320. In that properly biased condition, the gate voltage of the reference FET 302 (measured at gate terminal 304, for example) can then be used, in turn, to determine an appropriate gate bias voltage to be supplied to the power amplifier's main power transistor.

Although the reference FET 302 of bias control circuit 300 of FIG. 3 is described as being a depletion-mode FET, it should be understood that in various embodiments, reference FET 302 may instead be implemented using any other suitable transistor device (e.g., p-type MOS transistor, bipolar junction transistor (BJT), etc.), with or without modifications to bias control circuit 300. If reference FET 302 were implemented as an enhancement mode transistor, for example, translation circuit 326 can be configured to generate a positive gate bias voltage that is at least partially determined by the difference between the reference voltage and voltage at the transistor's drain terminal 306. Similarly, techniques and approaches may be utilized in which reference FET 302 is instead a BJT and in which case translation circuit 326 may be configured to generate an appropriate base terminal voltage.

Figure 4:
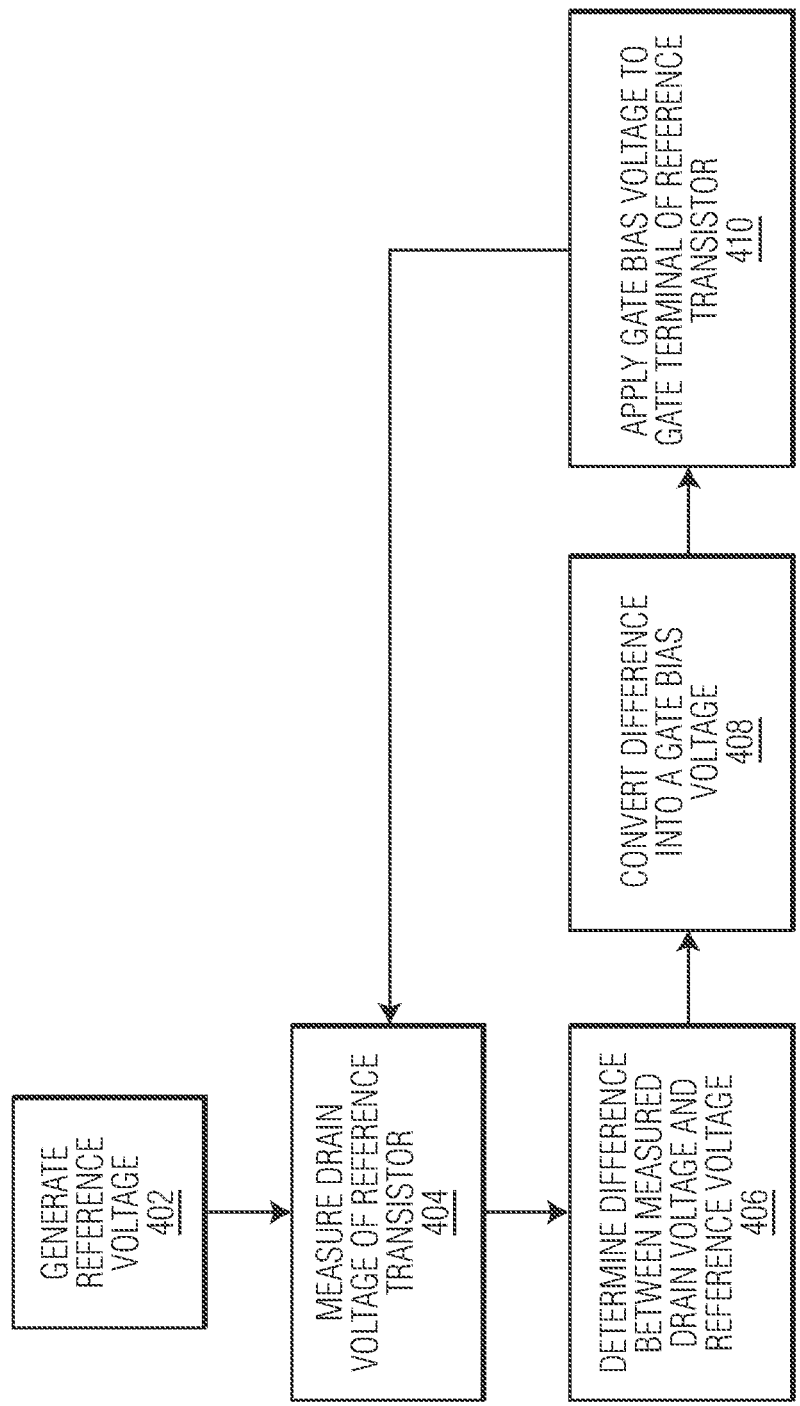
FIG. 4 is a flowchart depicting a method of biasing a reference FET.

FIG. 4 is a flowchart depicting a method 400 of biasing a reference FET (e.g., reference FET 302, FIG. 3) that may be implement by a bias control circuit (e.g., bias control circuit 300 of FIG. 3).

In a first step 402, a reference voltage value is determined. The reference voltage may, for example, be determined based on a control signal received from an external controller device (e.g., controller 330 of FIG. 3), wherein the control signal specifies a particular reference voltage.

In step 404, the drain voltage of the reference voltage (e.g., at node 324 of reference FET 302 of FIG. 3) is measured (e.g., by voltage sensor 322).

With the reference voltage determined and the drain voltage measured, in step 404 the difference between the measured drain voltage and the reference voltage is determined. Step 404 may be performed by any suitable component (e.g., voltage sensor 322) configured to determine the difference between the two voltages. Typically, the voltage is determined as the value of the reference voltage minus the measured drain voltage, though in other embodiments the approach for determining the voltage difference may be different (e.g., the reference voltage could be subtracted from the measured voltage).

In step 406, the difference between the measured drain voltage and the reference voltage that was determined in step 406 (e.g., generated in step 404) is converted into a corresponding gate bias voltage. In implementations in which the reference transistor is a depletion mode device (i.e., its gate threshold voltage is negative), this may involve converting the difference determined in step 406 into a corresponding negative voltage, where the negative voltage is suitable for application to the gate terminal of the reference transistor.

In step 410, the gate bias voltage determined in step 408 is applied to the gate terminal of the reference transistor (e.g., through current output stage 328 of FIG. 3).

Method 400 then returns to step 404 where the method repeats, and the drain voltage of the transistor is again measured, and a refined gate bias voltage is determined and supplied to the gate terminal of the reference transistor.

In some amplifier applications, and specifically those involving wireless signal transmissions, power amplifiers may be implemented using a Doherty amplifier architecture due to the architecture's high power-added efficiency over a wide power dynamic range.

A typical two-way Doherty amplifier implementation includes a carrier amplifier and a peaking amplifier that provide separate paths configured to amplify carrier and peaking signals, respectively. In a Doherty amplifier, the input RF signals applied to respective power transistors of the carrier amplifier and the peaking amplifier may each be biased in a similar manner to transistor 102 of FIG. 1 with an appropriate DC voltage selected to set the operating mode of each transistor in the Doherty amplifier. However, as described herein, manufacturing and temperature variations for each of the transistor dies in such a Doherty amplifier can produce a wide window of possible threshold voltages, which can in turn lead to significant changes in part to part (e.g., die to die) linearity, can make providing a suitable biasing voltage problematic, and can reduce performance efficiency. Furthermore, as they threshold voltages may change over time, such as due to the age of the transistors or their operating temperatures, threshold voltages can similarly change over time.

Consequently, embodiments of such amplifiers may be implemented that include bias controllers configured in accordance with the present disclosure. Consequently, multiple-path power amplifiers (e.g., such as Doherty-architecture amplifiers) may be implemented within reference transistor devices (e.g., reference FET 302) integrated into each of the amplifier's power transistor die. Bias controllers (e.g., bias control circuit 300 of FIG. 3) may be implemented in conjunction with each reference transistor device in the multi-path power amplifier, where each bias controller is configured to dynamically apply a desired biasing voltage to its corresponding reference transistor. In turn outputs generated by the bias controllers may be utilized to generate appropriate biasing voltages to be supplied to one or more power amplifier transistor (e.g., one or more carrier and/or peaking amplifier transistors) of the multi-path amplifier.

One or more of the embodiments of the bias controller circuit described herein may be utilized within a power amplifier device to account for part bias variations that can occur due to the aforementioned wide window of threshold voltage variations that may occur due to process and temperature variations, and also can track and maintain current bias density so as to reduce or minimize performance variations over temperature. This in effect can eliminate or reduce the extensive and cumbersome bias calibration routines that are typically implemented by end users to account for variations in relation to conventional power amplifier modules and, particularly, multi-path power amplifier modules. Managing such bias variations can help improve a power amplifier's efficiency and linearity in mMIMO (massive multiple-input, multiple-output) systems that include multiple-path amplifiers (e.g., Doherty amplifiers) and can remove the need to calibrate bias levels at the time of construction.

Figure 5:
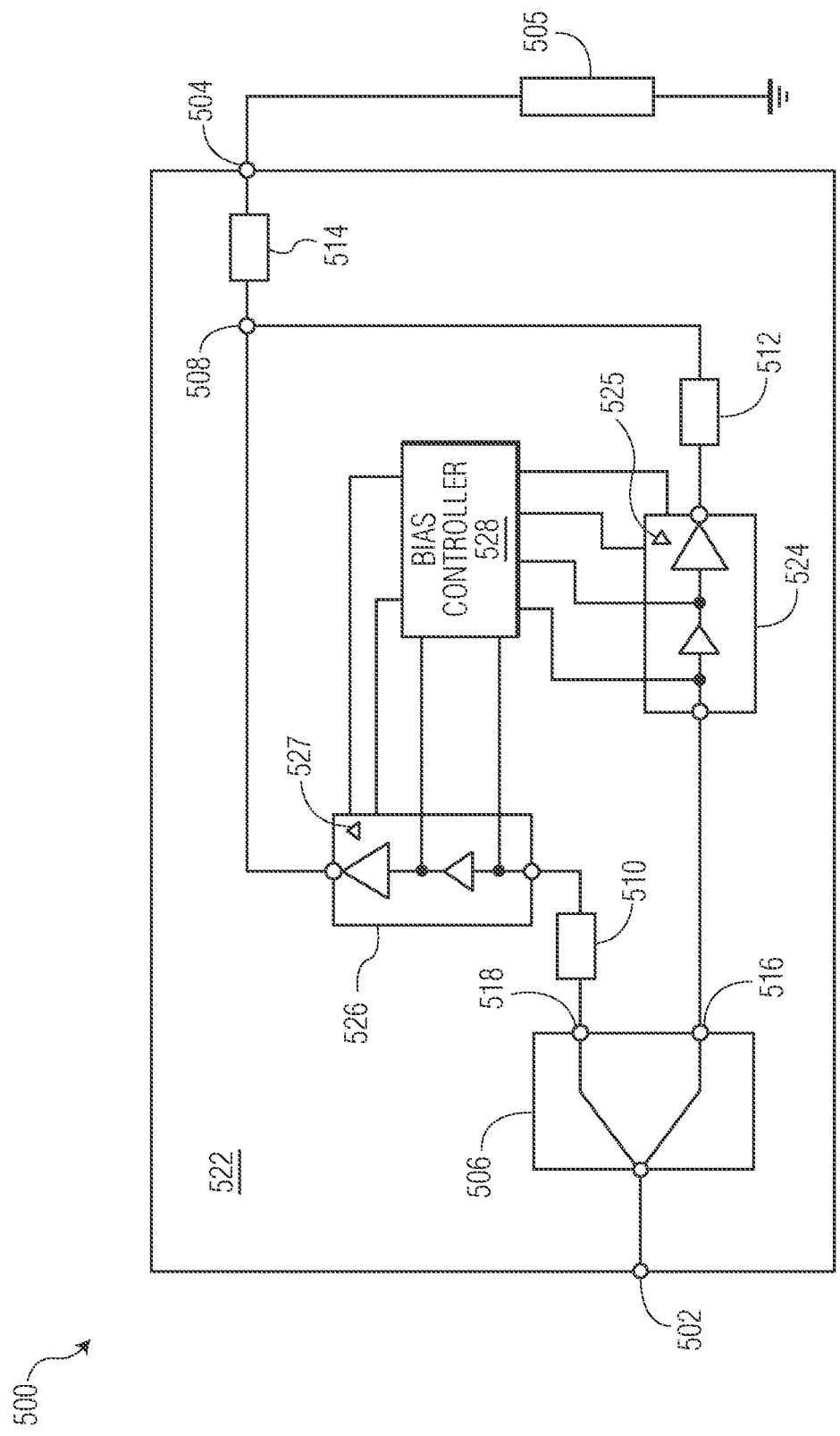
FIG. 5 is a schematic diagram of a Doherty amplifier system, in accordance with an example embodiment of the present disclosure.

FIG. 5 is a schematic diagram of a Doherty amplifier system 500, in accordance with an example embodiment. As depicted in FIG. 5, some or all components of the Doherty amplifier system 500 may be implemented in a single device package or module 522. As will be explained in detail later, and in accordance with various embodiments, the Doherty amplifier system 500 includes a dual stage peaking amplifier 524 (or peaking amplifier die), a dual stage carrier amplifier 526 (or carrier amplifier die), and a bias controller 528 (which may include a bias voltage generator, for example), where "dual stage" means that the amplifier has a series-coupled pre-amplifier or "driver" stage and a final or "output" amplifier stage. The bias controller 528 is electrically coupled to both the dual stage peaking amplifier 524 and the dual stage carrier amplifier 526 with eight distinct connections, although more or fewer connections may be used. In addition, either or both the dual stage peaking amplifier 524 and the dual stage carrier amplifier 526 may be single stage devices, or may have more than two amplification stages. Bias controller 528 may include two separate bias control circuits (e.g., implemented in accordance with the bias control circuit 300 of FIG. 3), one for each of dual stage peaking amplifier 524 and the dual stage carrier amplifier 526.

Reference FET devices 525 and 527 (e.g., each configured in the same manner as reference FET 302) are included on the dual stage carrier and peaking amplifier dies to account for process, voltage, and temperature variations.

Each bias control circuit in bias controller 528 is configured to establish appropriate bias voltages for the reference FET devices 525 and 527. The bias controller 528 then uses those bias voltage to determine appropriate bias voltages for dual stage carrier amplifier 526 and bias controller 528.

The bias control technique described herein can eliminate the need for off-die high tolerance and expensive surface mount resistors as well as a reference voltage supply, which requires offset calibration to setup proper biasing points. Such bias control techniques work well with an RF power amplifier module, such as the Doherty amplifier described with reference to FIG. 5.

The Doherty amplifier system 500 also includes a radio frequency (RF) input node 502, an RF output node 504 (which can be connected to a load 505, such as an antenna), a power splitter 506, a combining node 508, and first, second, and third phase shift/impedance inversion/matching components 510, 512, and 514, respectively. The dual stage peaking amplifier 524 and dual stage carrier amplifier 526 are coupled in parallel between the power splitter 506 and combining node 508. The dual stage carrier amplifier 526 particularly is coupled between the combining node 508 and a first output port 516 of the power splitter 506, with the second phase shift/impedance inversion/matching component 512 being coupled between that amplifier and the combining node 508. The dual stage peaking amplifier 524 is coupled between a second output port 518 of the power splitter 506 and the combining node 508, with the first phase shift/impedance inversion/matching component 510 being coupled between the second output port 518 and that amplifier. The combining node 508 is in turn coupled to the RF output node 504 by way of the third phase shift/impedance inversion/matching component 514 coupled therebetween.

An embodiment of a system includes a reference field effect transistor (FET), wherein the reference FET is a depletion mode transistor; and a bias control circuit, including a voltage sensor connected to a drain terminal of the reference FET. The voltage sensor is configured to measure a voltage at the drain terminal of the reference FET as a measured voltage, determine a voltage difference between a reference voltage and the measured voltage, and output the voltage difference at a voltage sensor output terminal. The system includes a translation circuit connected the voltage sensor output terminal. The translation circuit is configured to convert the voltage difference into a negative gate bias voltage, and apply the negative gate bias voltage to a gate terminal of the reference FET. In some aspects, the techniques described herein relate to a system, wherein the reference FET is a gallium nitride (GaN) transistor. In some aspects, the techniques described herein relate to a system, further including a current output stage connected between a translation circuit output and the gate terminal of the reference FET, wherein the current output stage is configured to operate as a current buffer. In some aspects, the techniques described herein relate to a system, where the bias control circuit includes a negative voltage terminal configured to receive a first voltage and the translation circuit is configured to generate the negative gate bias voltage as a value referenced against the first voltage. In some aspects, the techniques described herein relate to a system, further including a reference voltage generator connected to the voltage sensor, wherein the reference voltage generator is configured to output the reference voltage. In some aspects, the techniques described herein relate to a system, further including a controller connected to the reference voltage generator, wherein the controller is configured to determine a voltage of the reference voltage output by the reference voltage generator.

In some aspects, the techniques described herein relate to a system, further including a charge pump connected between a positive voltage terminal at a second voltage and a ground terminal, wherein the charge pump is configured to increase the second voltage to a third voltage and output the third voltage at a charge pump output terminal that is connected to a drain terminal of the reference FET, wherein the third voltage is greater than a drain-source saturation voltage of the reference FET.

In some aspects, the techniques described herein relate to a system, further including a resistor connected between the charge pump output terminal and the drain terminal of the reference FET.

In some aspects, the techniques described herein relate to a system, wherein the resistor has a resistance between 200 Ohms to 500 Ohms.

In some aspects, a system includes an integrated circuit die, including a reference transistor, and a power transistor. The system includes a bias control circuit, including a reference voltage generator configured to output a reference voltage, and a voltage sensor connected to the reference voltage generator and a drain terminal of the reference transistor. The voltage sensor is configured to generate an output voltage equal to a difference between the reference voltage and a drain voltage of the drain terminal. The bias control circuit includes a translation circuit connected to the voltage sensor. The translation circuit is configured to convert the output voltage of the voltage sensor into a reference gate bias voltage, and apply the reference gate bias voltage to a gate terminal of the reference transistor.

In some aspects, a method includes determining a voltage difference between a reference voltage and a drain voltage of a reference transistor, converting the voltage difference into a first gate bias voltage, applying the first gate bias voltage to a gate terminal of the reference transistor, and determining a second gate bias voltage of a power transistor based upon the first gate bias voltage of the reference transistor. In some aspects, the method includes converting the voltage difference into the first gate bias voltage includes referencing the voltage difference against a negative supply voltage. In some aspects, the method includes transmitting a control signal to a reference voltage generator wherein the control signal is configured to determine the reference voltage. In some aspects, a gate-to-source threshold voltage of the reference transistor is correlated with a gate-to-source threshold voltage of the power transistor, given changes in temperatures of the reference transistor and the power transistor or ages of the reference transistor and the power transistor.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching may be utilized in the figures, the different elements within the structural layers may be formed out of the same material.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or database devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A system, comprising:
a reference field effect transistor (FET), wherein the reference FET is a depletion mode transistor; and
a bias control circuit, including:
a voltage sensor connected to a drain terminal of the reference FET, where the voltage sensor is configured to:
measure a voltage at the drain terminal of the reference FET as a measured voltage,
determine a voltage difference between a reference voltage and the measured voltage, and
output the voltage difference at a voltage sensor output terminal, and
a translation circuit connected the voltage sensor output terminal, the translation circuit being configured to:
convert the voltage difference into a negative gate bias voltage, and apply the negative gate bias voltage to a gate terminal of the reference FET.

2. The system of claim 1, wherein the reference FET is a gallium nitride (GaN) transistor.

3. The system of claim 1, further comprising a current output stage connected between a translation circuit output and the gate terminal of the reference FET, wherein the current output stage is configured to operate as a current buffer.

4. The system of claim 1, where the bias control circuit includes a negative voltage terminal configured to receive a first voltage and the translation circuit is configured to generate the negative gate bias voltage as a value referenced against the first voltage.

5. The system of claim 1, further comprising a reference voltage generator connected to the voltage sensor, wherein the reference voltage generator is configured to output the reference voltage.

6. The system of claim 5, further comprising a controller connected to the reference voltage generator, wherein the controller is configured to determine a voltage of the reference voltage output by the reference voltage generator.

7. The system of claim 1, further comprising:
a charge pump connected between a positive voltage terminal at a second voltage and a ground terminal, wherein the charge pump is configured to increase the second voltage to a third voltage and output the third voltage at a charge pump output terminal that is connected to a drain terminal of the reference FET, wherein the third voltage is greater than a drain-source saturation voltage of the reference FET.

8. The system of claim 7, further comprising a resistor connected between the charge pump output terminal and the drain terminal of the reference FET.

9. The system of claim 8, wherein the resistor has a resistance between 200 Ohms to 500 Ohms.

10. A system, comprising:
an integrated circuit die, including:
a reference transistor, and
a power transistor;
a bias control circuit, including:
a reference voltage generator configured to output a reference voltage,
a voltage sensor connected to the reference voltage generator and a drain terminal of the reference transistor, the voltage sensor being configured to generate an output voltage equal to a difference between the reference voltage and a drain voltage of the drain terminal, and
a translation circuit connected to the voltage sensor, the translation circuit being configured to:
convert the output voltage of the voltage sensor into a reference gate bias voltage, and
apply the reference gate bias voltage to a gate terminal of the reference transistor.

11. The system of claim 10, wherein the reference transistor is a first gallium nitride (GaN) transistor and the power transistor is a second GaN transistor.

12. The system of claim 10, wherein the bias control circuit further comprises a current output stage connected between a translation circuit output and the gate terminal of the reference transistor.

13. The system of claim 10, wherein the bias control circuit further comprises a controller connected to the reference voltage generator, wherein the controller is configured to determine a voltage of the reference voltage output by the reference voltage generator.

14. The system of claim 10, wherein the bias control circuit further comprises:
a charge pump connected between a positive voltage terminal at a second voltage and a ground terminal, wherein the charge pump is configured to increase the second voltage to a third voltage and output the third voltage at a charge pump output terminal connected to a drain terminal of the reference transistor, wherein the third voltage is greater than a drain-source saturation voltage of the reference transistor.

15. The system of claim 14, wherein the bias control circuit further comprises a resistor connected between the charge pump output terminal and the drain terminal of the reference transistor.

16. The system of claim 15, wherein the resistor has a resistance between 200 Ohms to 500 Ohms.

* * * * *